United States Patent
Inganas et al.

(10) Patent No.: US 6,326,936 B1
(45) Date of Patent: Dec. 4, 2001

(54) ELECTRODE MEANS, COMPRISING POLYMER MATERIALS, WITH OR WITHOUT FUNCTIONAL ELEMENTS AND AN ELECTRODE DEVICE FORMED OF SAID MEANS

(75) Inventors: Olle Werner Inganas, Linköping (SE); Danilo Pede, Lecce (IT); Magnus Granström, Linköping (SE); Geirr Ivarsson Leistad, Sandvika (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/147,844
(22) PCT Filed: Jul. 13, 1998
(86) PCT No.: PCT/NO98/00212
   § 371 Date: Mar. 18, 1999
   § 102(e) Date: Mar. 18, 1999
(87) PCT Pub. No.: WO99/08325
   PCT Pub. Date: Feb. 18, 1999

(30) Foreign Application Priority Data

Jul. 22, 1997 (NO) ........................................ 973390

(51) Int. Cl.[7] ........................................ G09G 3/20
(52) U.S. Cl. ........................ 345/55; 345/206; 257/700; 257/708
(58) Field of Search ................... 345/74, 76, 87, 345/55, 204, 206, 205; 313/499, 500, 501, 502, 503, 504, 505, 506, 507; 257/700, 708, 758, 87

(56) References Cited

U.S. PATENT DOCUMENTS

| | | | |
|---|---|---|---|
| 4,677,742 | * 7/1987 | Johnson | 29/591 |
| 4,684,972 | * 8/1987 | Owen et al. | 357/59 |
| 4,876,668 | 10/1989 | Thakoor et al. | |
| 5,464,990 | 11/1995 | Shiratsuki et al. | |
| 5,739,545 | 4/1998 | Guha et al. | |
| 5,897,414 | * 4/1999 | Bergeron et al. | 445/3 |
| 5,976,419 | * 11/1999 | Hawkins et al. | 252/512 |

FOREIGN PATENT DOCUMENTS

| | | | |
|---|---|---|---|
| 0 144 604 | 6/1985 | (EP) | . |
| 0 619 594 | 10/1994 | (EP) | . |
| 0619594 A | * 10/1994 | (EP) | H01J/1/30 |
| 62-121424 | 6/1987 | (JP) | . |
| 2-215173 | 8/1990 | (JP) | . |
| 4-115490 | 4/1992 | (JP) | . |

OTHER PUBLICATIONS

Vacuum, vol. 43, No. 11, pp. 1019–1023, 1992 "A new material for optical, electrical and electronic thin film memories".

* cited by examiner

Primary Examiner—Bipin Shalwala
Assistant Examiner—Mansour M. Said
(74) Attorney, Agent, or Firm—Jacobson Holman, PLLC

(57) ABSTRACT

In an electrode device for addressing a functional element a layer of electrical isolating materials is provided between first and second electrodes intersecting without direct physical or electrical contact and forming a bridge structure. Over both electrodes an electrical conducting or semiconducting contact layer of organic material is provided and contacts both electrodes electrically. In an electrode device with detecting, information storing and/or information indicating function an electrically addressable functional element is provided adjacent to or in the intersection between the electrodes. In an electrode device including two or more electrode device, the electrodes form patterned layers of row and column electrodes in a 2-dimensional matrix, wherein the contact layer forms a patterned or integrated global layer and functional elements which each registers with an electrode intersection in the matrix, are provided in one or more patterned or non-patterned layers.

45 Claims, 7 Drawing Sheets

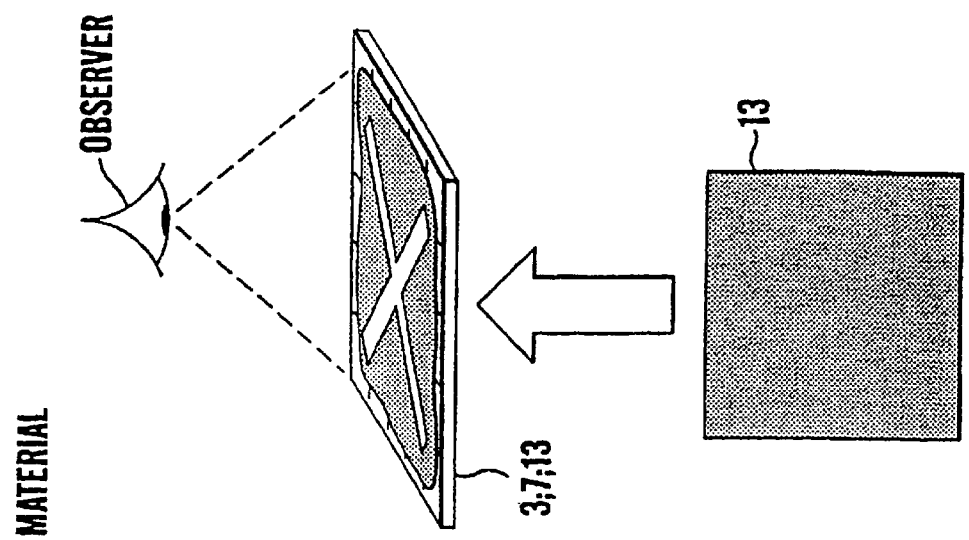
Fig. 11 (DISPLAY)
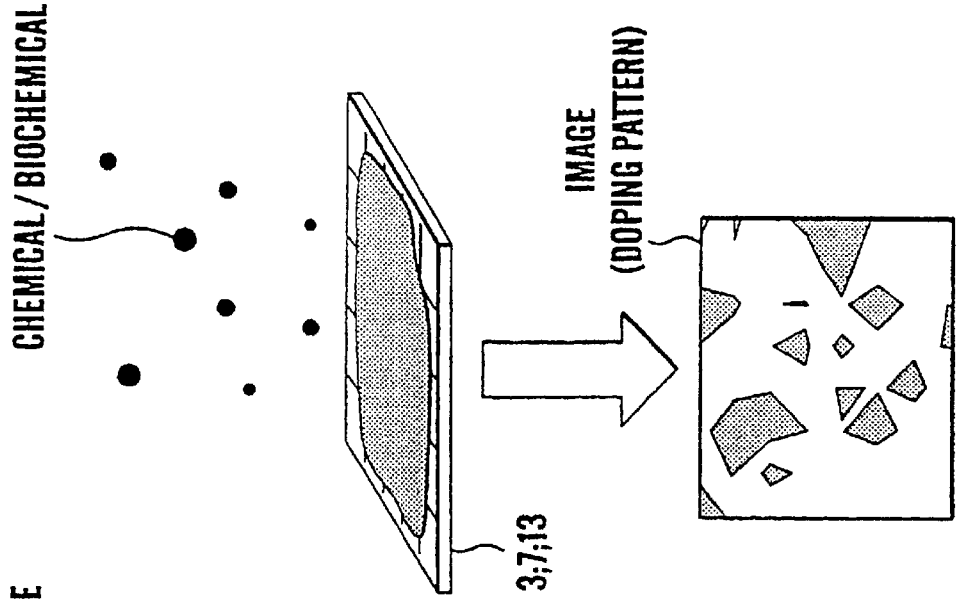
Fig. 10 (CHEMICAL CAMERA)
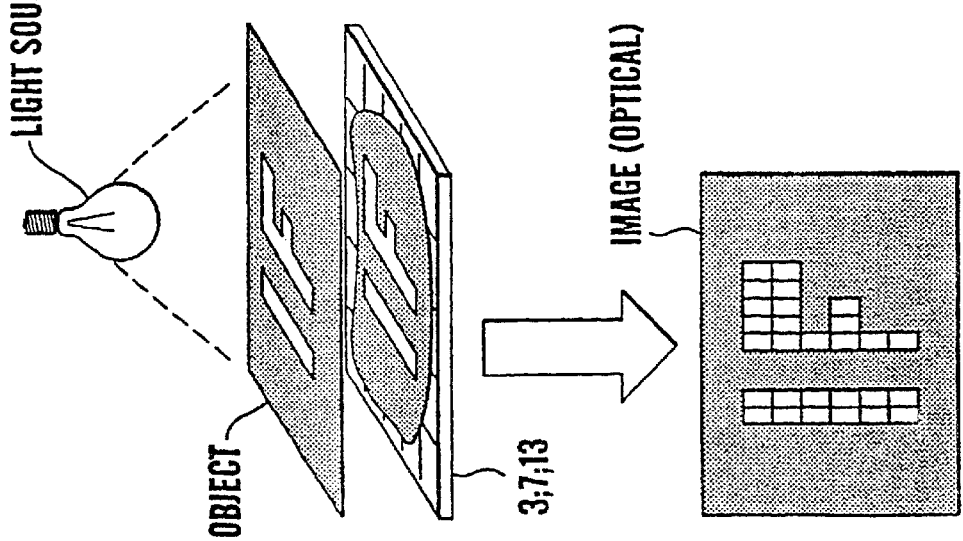
Fig. 9 (OPTICAL/ELECTRONIC CAMERA)

ELECTRODE MEANS, COMPRISING POLYMER MATERIALS, WITH OR WITHOUT FUNCTIONAL ELEMENTS AND AN ELECTRODE DEVICE FORMED OF SAID MEANS

FIELD OF THE INVENTION

The invention concerns an electrode means, particularly for addressing of a functional element, comprising a first and a second electrode. The invention also concerns an electrode means with detecting information storing and/or information indicating function, comprising a first and a second electrode and a functional element and with passive electrical addressing of the functional element. Further the invention concerns an electrode device with detecting, information storing and/or information indicating function, wherein the electrode device comprises two or more electrode means each with a functional element and with passive electrical addressing of the functional elements in the electrode device.

BACKGROUND OF THE INVENTION

Finally, the invention also concerns uses of an electrode device of this kind.

There are known a number of technical solutions for addressing functional elements, for instance in the form of pixels, on a surface. However, few of them allow a simple passive addressing of the functional element and a number thereof requires fairly complicated thin-film transistor technologies. Such very sophisticated solutions are encumbered with a low manufacturing yield and the problems are also amplified when a very large surface element shall be covered with functional elements, such as is the case for instance in the manufacturing of a "screen" which shall consist of pixels.

One solution of the problem with addressing of functional elements is to provide the functional elements such that they form elements in the rows and the columns in a x,y-matrix and applying a voltage at x to one row and at y to one column such that a given voltage is supplied at the functional element, symbolically denoted as $V_x+V_y$, $V_x+V_y>V_0$, where $V_0$ is a critical threshold voltage for the process to be controlled by the functional element, for instance switching of a liquid crystal display material between two orientation states. In order to cover a surface with rows and columns of functional elements in this way it is required that the rows and the columns are not electrically connected in any point, apart from in the functional element in the x,y-position to be addressed, in other words in the intersection between the row x and the column y. This is not achieved when it is simultaneously required that the functional element shall comprise a very large portion of the active surface. One solution to this problem is providing the rows in one plane and the columns in another plane and connecting them electrically over current paths from a lower electrode pattern to an upper electrode pattern. If for instance there are n rows and n columns, it is necessary to form $n^2$ current paths which shall all work.

SUMMARY OF THE INVENTION

The first object of the invention is hence to provide an electrode means which makes possible a passive addressing of a functional element without the necessity of forming current paths of this kind, particularly where such functional elements are part of a two-dimensional matrix, for instance formed as pixels in an image screen.

Another object of the invention is to provide an electrode means with a functional element, wherein the functional element can be given a detecting, information storing and/or information indicating function.

A third object of the invention is to provide an electrode means with a functional element of the above-mentioned kind and an electrode device consisting of such electrode means integrated in a two-dimensional matrix, wherein the functional element is not provided between the electrodes but is located on one side of the electrodes. This will make it possible to form e.g. image screens wherein the functional element in the form of pixels is turned towards the outside and exposed to an observer or a sensor device, the functional elements in the form of sensor elements being exposed to the environment.

A fourth object of the invention is to provide an electrode means wherein the electrical connection between the electrodes can be generated by using a contact layer with an anisotropic electrical conductor, something which implies the possibility of providing a rectifying connection between an anisotropic conductor and one or both electrodes, such that the problem with constructing a passive addressable electrode device hence is significantly simplified relative to the prior art.

The above features and advantages are achieved according to the invention with an electrode means which is characterized in that the first electrode is provided in the form of a substantially strip-like structure of an electrical conducting material, that the second electrode is provided over the first electrode in the form of likewise substantially strip-like structure of an electrically conducting material and in substantially orthogonal intersecting relationship to the first electrode, that a layer of electrical isolating material is provided at the intersection between the first and the second electrode, such that the electrodes intersect each other without direct physical and electrical contact and hence form a bridge structure, and that a contact layer of an electrical conducting or semiconducting material is provided above the first electrode and the second electrode, contacting both the first and the second electrode electrically; an electrode means which is characterized in that the first electrode is provided in the form of a substantially strip-like structure of an electrical conducting material, that the second electrode is provided over the first electrode in the form of a likewise substantially strip-like structure of an electrical conducting material and in substantially orthogonal intersecting relationship to the first electrode, that a layer of electrical isolating material is provided at the intersection between the first and the second electrode, such that the electrodes intersect each other without direct physical or an electrical contact and hence forms a bridge structure, that a contact layer of an electrical conducting or semiconducting material which contacts both the first and the second electrically is provided over the first electrode and the second electrode, and that a functional element is provided substantially adjacent to or at the intersection of the electrodes, said functional elements being configured either as a sensor element or an information storing and/or information indicating element; and an electrode device which is characterized in that the electrode means are integrated in a quasi two-dimensional matrix, that the first electrodes form a patterned layer of row electrodes in the matrix, that the second electrodes without being in direct physical or electrical contact with the row electrodes form a patterned layer of column electrodes in the matrix, that the contact layer either integrated forms a global contact layer in the matrix or patterned is assigned to each separate electrode means, that the electrical conducting or semiconducting material in the contact layer is provided over both electrode layers and contacts these electrically, and that the fictional elements provided in or over the contact layer form one or more patterned or non-patterned layers of functional elements provided in respective two-dimensional matrices, the separate functional element registering with the respective intersection between a row electrode and a column electrode in the electrode layers.

The use of the electrode device in an electronic camera is disclosed by the independent claim 35.

The use of the electrode device in a chemical camera is disclosed by the independent claim 36.

The use of the electrode device in an electrically addressable memory device or electrically addressable data processing device is disclosed by the independent claim 37.

The use of the electrode device in an electrically addressable display device is disclosed by the independent claim 38.

According to the invention the first and the second electrode advantageously consist of metal with high or low work function or vice versa.

According to the invention the contact layer advantageously forms a rectifying electric contact with the first electrode and ohmic contact with the second electrode or vice versa.

According to the invention the electrical conducting or semiconducting material in the contact layer is an anisotropic conductor or semiconductor, wherein an anisotropic conductor preferably comprises an electrical isolating matrix in the form of a non-conducting polymer material and embedded therein at least an electrical conducting material, the electrical conducting polymer material being separated in domains with an extension at least the thickness of the contact layer.

Further, according to the invention the functional element advantageously either is provided in or formed as a part of the contact layer over the intersection electrodes or substantially conformal therewith, or provided as a separate element over the contact layer and such that it substantially register with the intersection of the electrodes. Preferably the functional element is respectively a potential-controlled inorganic or organic metal or a potential-controlled semiconductor, a current injectable inorganic or organic metal or a current injectable semiconductor or a charge-storing inorganic or organic metal or a charge-storing semiconductor, said materials comprising electroactive and/or electrochromic materials whose optical properties change with the amount of charge stored.

According to the invention it is particularly preferred that the separate functional element is an inorganic or organic metal or a semiconductor which outputs a response signal as response to a specific physical stimulus.

According to the invention it is likewise particularly preferred that the separate functional element is an inorganic or organic metal or a semiconductor which output the response signal as response to a specific chemical reagent.

According to the invention it is also advantageous that the electrode device is realized in thin-film technology, and that the functional element layer is formed by deposition of a polymer layer from the solution of a single conducting polymer or a polymer mixture comprising at least one conducting polymer, said conducting polymer being in a doped or undoped state.

Further features and advantages of the invention are disclosed by the additional appended dependent claims.

The invention shall now be explained in more detail by exemplary embodiments and with reference to the accompanying drawings wherein

DETAILED DESCRIPTION OF THE PREFERRED EMBODIMENT

Figure 1A:
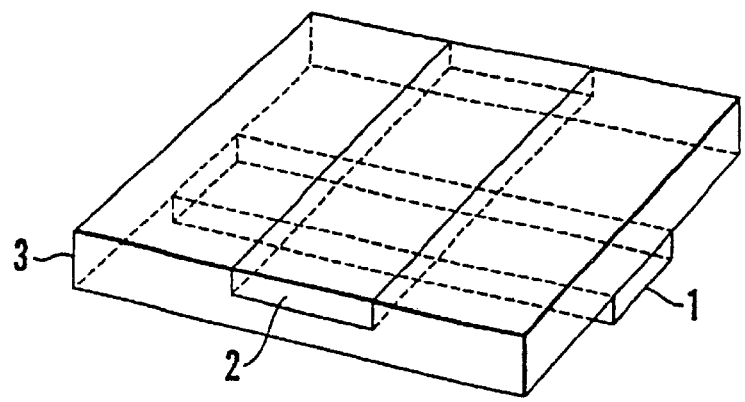
FIG. 1*a* shows a perspective view of an electrode means according to prior art, FIG. 1*b* a plan view of the electrode means in FIG. 1*a*, FIGS. 2*a* and 2*b* are perspective views of an electrode means according to the invention, FIG. 2*c* a plan view of the electrode means in FIG. 2*a*, FIG. 2*d* a section through a contact layer made with an anisotropic conductor embedded in a matrix, FIG. 3*a* a perspective view of an electrode means with a functional element according to the invention, FIG. 3*b* a principle view of the structure of a functional element and particularly realized as a sensor element, FIG. 3*c* a section of the electrode means in FIG. 3*a*, FIG. 3*d* a plan view of the electrode device in FIG. 3*a*, FIG. 4 a first preferred embodiment of the electrode means in FIG. 3*a*, FIG. 5 a second preferred embodiment of the electrode means in FIG. 3*a*, FIG. 6 a third preferred embodiment of the electrode means in FIG. 3*a*, FIG. 7 the electrode device according to the invention and implemented with input and output means for driving of the electrode means and detection of the output signals, FIG. 8 an equivalent diode network for the electrode device according to the invention, FIG. 9 schematically the use of the electrode device according to the invention in an optical or electronic camera, FIG. 10 schematically the use of the electrode device according to the invention in a chemical camera, and FIG. 11 schematically the use of the electrode device according to the invention in a display device.

FIG. 1*a* shows in perspective view an electrode means realized according to prior art, i.e in the form of a sandwich structure wherein a layer of active material 3 is provided over a first electrode 4, in this case active polymer and provided thereabove again a second electrode 2, for instance an indium tin electrode on a not shown glass substrate. The active polymer 3 may include light-emitting polymer diodes which exploit the rectifying connection formed between a conjugated polymer and the metal electrode 1. A number of these polymers is of the P-type and hence a rectifying connection may be obtained by the contact to a metal with low work functions such as aluminium, calcium or indium. Electrode means wherein the polymer is sandwiched between two electrode layers have formerly been used for photodetection purposes. In most of these means it is common that one of the electrodes mentioned is a transparent indium-tin oxide (ITO) on a glass substrate, while the first electrode 1, i.e the metal electrode, is made in the form of a layer which is evaporated onto the polymer material. In these means light will pass through the transparent sided of the sensor. An electrode means of this kind is commonly used in light emitting devices. The same geometry may easily be extended to the construction of a photodiode matrix. As the polymer material 3 will be located between the electrodes 1, 2 the deposition of the first or lower electrode may, however, easily damage the overlying polymer material. In the evaporation metal may for instance percolate through the polymer material and form short circuits, and chemical reactions may take place which may change the polymer material. If a photoresist-based method is used for patterning the first or lower electrode in an electrode means in sandwich construction, the polymer material must be able to withstand all solvents and etching agent which are used.

Figure 1B:
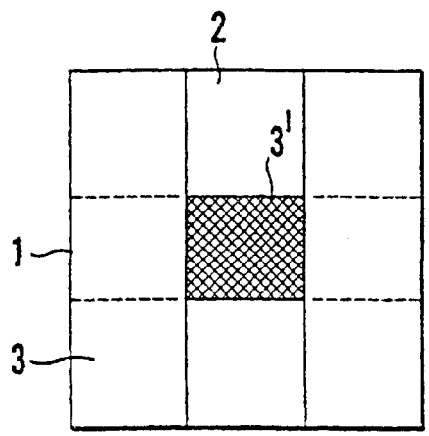
Figure 2C:
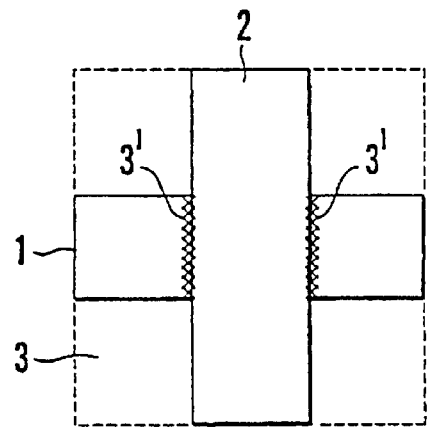

As the active polymer material is located between the electrodes 1, 2 the electrode means in sandwich construction firer will be less suitable for a number of purposes. For instance it cannot be used for addressing detector matrices consisting of polymer sensors adapted for the reacting to specific chemical species unless these are able to penetrate through one of the layers. If the electrode means in the sandwich construction are used for addressing of detector matrices in electron cameras or pixels in display devices, this presupposes also that at least one of the electrodes is transparent. FIG. 1*b* shows a plan view of the electrode means in the sandwich construction of FIG. 1*a*. The active area 3' in the electrode means is shown hatched and is formed as will be seen, by the whole area which is located between the electrodes 1, 2 in the intersection. That should imply that the sandwich construction of an electrode means is very well suited for use as a photodetector, as the active area 3' is the product of the electrode width and hence will generate a relatively high photocurrent. in sandwich construction, the polymer material must be able to withstand all solvents and etching agent which are used.-Please The electrode means according to the present invention is realized as a bridge structure, as this is shown in perspective in FIG. 2*a*. Herein the first electrode 1, for instance an aluminium electrode, is formed on a not shown substrate which for instance may consist of silicon. Over the aluminium electrode 1 a layer of electrical isolating material is provided and on the top of this layer the second electrode which similarly may be a metal, for instance gold, is provided. The material in respectively the first and the second electrode 1, 2 shall have different work functions for reasons which are to be discussed in more detail below. The isolating layer 4 needs only to be provided at the intersection between the electrodes, i.e. where the electrodes 1, 2 overlap each other, such that they hence form the bridge structure and intersect each other without direct physical or electrical contact. The isolating layer 4 is preferably deposited by means of spin coating, such that it is formed as a thin film. As shown in FIG. 2*a* and in plan view in FIG. 2*b*, the electrodes 1, 2 are substantially realized as strip-like structures and provided mutually orthogonal. By the intersection of the electrode it shall hence in coarse features be understood the area which two electrodes mutually cover and which hence substantially will be equal to the product of the electrode width. As shown in FIG. 2*b*, the upper surface of the second electrode 2 is initially exposed. If the isolating layer 4 is deposited such that it covers the whole first electrode 1, the isolating layer after the second electrode 2 has been deposit may be removed where it is not covered by the second electrode, for instance by means of etching.

The electrode materials themselves may be deposited by evaporation and if the first electrode 1 is provided on a substrate of for instance silicon, it may be grown an oxide layer on the surface of the silicon, for instance with a thickness of about 1 $\mu$m in order to ensure electrical isolation if the electrode means is made in an integrated process, i.e. with a plurality of electrode means on one and the same substrate. The electrodes are vapor-deposited, for instance with a thickness between 200 and 250 nm, as thinner electrodes easily may be damaged during the etching process for removing superfluous portions of the isolating layer. As the isolating material in the isolating layer 4 benzocyclobutene (BCB) was used. A solution of benzocyclobutene 1:2 in mesitylene was spin coated on the top of the first electrode and the substrate in the course of 30 s with a spin rate of 1000 rpm. The curing of the isolation layer lasted 1 hour at 200° C. The thickness could vary from 200 to 400 nm depending on the solution temperature before the spin coating.

In one embodiment the gold electrode was vapor-deposited on the top of the isolation layer 4. The mechanical stability of gold on benzocyclobutene, however, is poor and hence a 2 nm thick layer of chromium was vapor-deposited before the deposition of the gold electrode. The thickness of the gold electrode proper was 50 nm. As mentioned above, the portion of the isolation layer 4 which is not covered by the second electrode 2 is removed. By using reactive ion etching this removal process took less than 2 minutes and a means with a structure as shown in FIG. 2*b* then appeared.

Over both electrodes 1, 2 a contact layer 3 of an electrical conducting or semiconducting material shall now be provided and which contacts both the first and the second electrode electrically. The embodiment of the electrode means in FIG. 2*a* with the contact layer 3 deposited is shown in plan view in FIG. 2*c*. Along two opposite side edges of the second electrode 2 and to the first electrode 1 the contact layer 3 forms active areas 3'. These have much smaller extension than which is the case in the embodiment in the sandwich construction, but the difference in current values will be inessential when the electrodes 1, 2 are made extremely narrow. In the following discussion of the narrow embodiment of the contact layer 3 the point of departure is that the electrical conducting or semiconducting material in the contact layer is an anisotropic conductor or semiconductor. Specifically the discussion will be directed towards the use of an anisotropic conductor made of polymer materials. It is, however, nothing against that in certain embodiments it often may be expedient to use an anisotropic material in the contact layer 3. By the first and second electrode 1, 2 for instance comprising a metal with a high or low work function or vice versa, the contact layer 3 as mentioned above will form a rectifying electrical contact with the first electrode 1 and an ohmic contact with the second electrode 2 or vice versa.

Figure 2D:
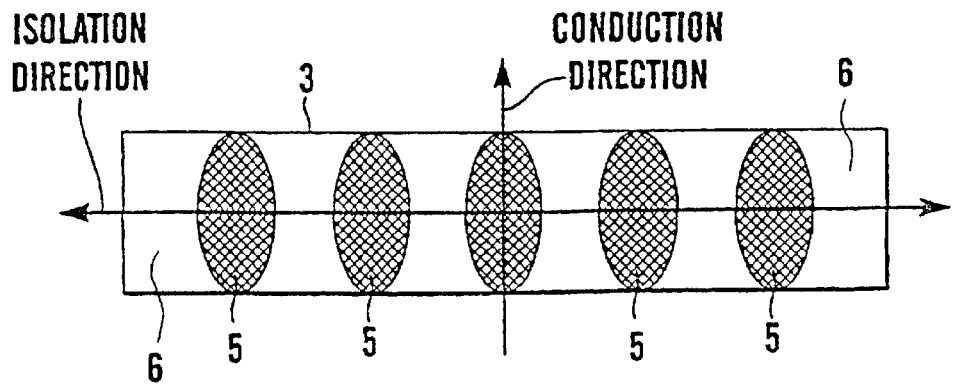
Figure 2A:
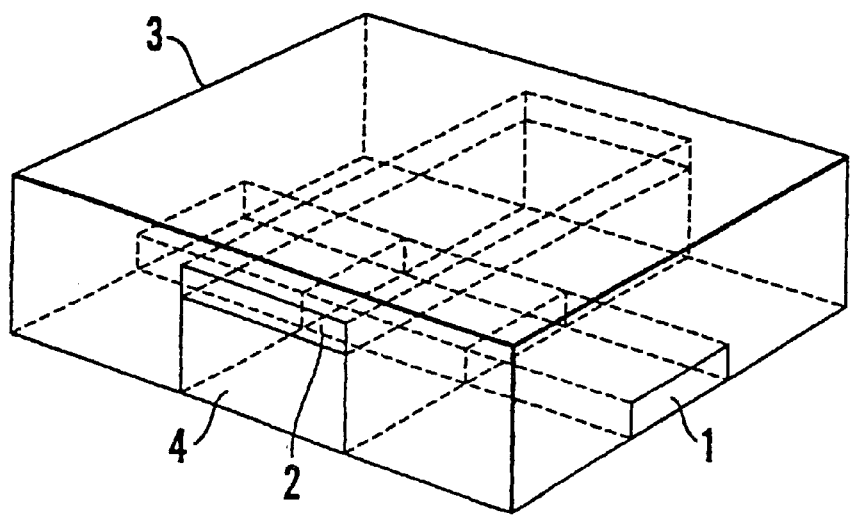
Figure 2B:
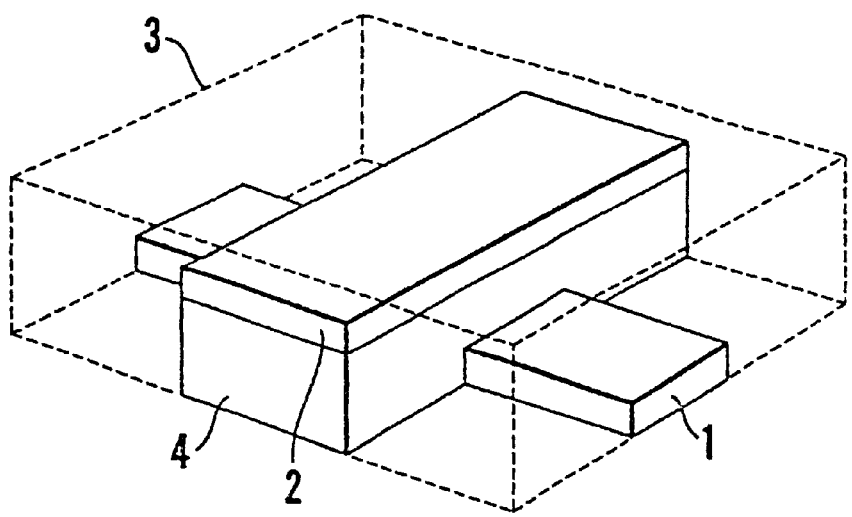

The contact layer 3 with anisotropic conductor is shown schematically in FIG. 2*d*. The contact layer comprises an electrical isolating matrix 6 in the form of a non-conductive polymer material and embedded therein at least an electrical conducting polymer material 5. As shown in FIG. 2*d* the electrical conducting polymer material 5 is separated in domains with an extension at least the thickness of the contact layer 3. A person skilled in the art will easily realize that if a contact layer 3 with an anisotropic conductor forms ohmic contacts with both the first and the second electrode 1, 2, it will not be possible to selectively address the intersection point between the electrodes. Selective addressing requires that exactly one of the contacts is a rectifying contact. It is well-known that metal contacts of undoped and doped conjugated polymers may be rectifying. This is for instance the case for contacts between aluminium and doped or undoped substitutes of polythiophenes. On the other hand gold forms an ohmic contact with these materials, both in their doped and undoped states. By the first electrode 1 being made in aluminium, the anisotropic conductor will if it is formed of a polymer mixture, always form a rectifying contact with the first electrode 1, while the contact with the gold electrode 2 on the top will be ohmic.

With regard to the design of the contact layer 3 it shall generally be remarked that materials with high electronic conductivity normally are present or are used in isotropic forms. When a microscopic anisotropic conductivity is present, it is only when single crystals of metallic or semiconducting materials are used that these anisotropic conductive properties clearly appears as a macroscopic anisotropic conductivity. It is, however, a number of situations wherein anisotropic electrical conductivity may be attractive and a number of hybrid materials and devices with these properties are used in the art. These often consist of composites of conductors in isolators which by some process or other have been designed such that anisotropic electrical conductivity is provided. For instance are elastomers used in so-called flip-chip contacting. Also anisotropic conducting adhesives based on a matrix which includes metal particles are known. These are normally used in thick-film structures.

A very simple realization of anisotropic conductivity may be obtained with films of polymer mixtures between a conjugated and a conductive polymer and at least one matrix polymer which is isolating. Normally a phase separation is observed in a mixture of this kind. (See e.g. International Patent application PCT/SE95/00549 with the title "Colour source and methods for its fabrication"). When the conjugated polymers form domains with thickness which is comparable to the film thickness, i.e. the thickness of the contact layer, such that the conducting domains are exposed at both the upper and lower side of the film, it is possible to provide these films between conductors for forming electrical contact. By choosing a stoichiometry of the polymer mixture such that the conductivity parallel to the film is very low due to absence of two-dimensional percolation paths, it is easy to form a thin anisotropic conductor as it is schematically shown in FIG. 2*d*. The anisotropy relationship between the conductance along the perpendicular to the film and the conductivity parallel with the extension of the film direction may easily be several orders of magnitude. A film of this kind may easily be made by spin coating from a solution of one or more conjugated polymers or one or more isolating polymers. The film may also be made with solvent casting, melt casting or even with coating with the use of a solution or gel.

Preferably the non-conducting material is selected among the class of homo- and copolymers of polyacrylates, polyesters, polycarbonates, polystyrenes, polyolefines or other polymers with a non-conjugated backbone. Particularly it is preferred that the non-conducting polymer material is polymethylmetacrylate (PMMA).

Preferably the electrical conducting polymer material which furnishes the contact layer with its anisotropic conducting properties may be selected among the class of polyheterocyclic polymers such as substituted polythiophenes, substituted polythiophenvinylenes, substituted polypyrrols, polyaniline and substituted polyanilines, substituted polyparaphenylvinylenes and their copolymers. Particularly it is preferred that the electrical conducting polymer material is poly[3-(4-octylphenyl)-2.2'-bithiophene] (PTOPT).

A contact layer with a thickness of 100 nm and consisting of PTOPT in a PMMA matrix was deposited on a gold surface. By means of atomic force microscopy (AFM) it was confirmed that the domains extended through the 100 nm thick contact layer to its surface and was fairly evenly distributed therein with a typical diameter in the cross direction of a few tens of nanometers.

Now an electrode means with a functional element 7 which may have a detecting, information storing and/or information indicating function shall be described. Particularly the functional element 7 may an electrically sensitive, chemically sensitive, photo-sensitive or radiation emitting element, and the use of the electrode means according to the invention will allow passive electrical addressing of the functional element. The functional element 7 is provided adjacent to or in the intersection of the electrodes 1, 2 and may either be provided and formed as a portion of the contact layer 3 over the intersection of the electrodes and will then substantially be conformal therewith, such that the functional element 7 substantially corresponds to the active areas 3' as shown in FIG. 2*c*. But the functional element 7 may also be realized as a separate element and provided at the intersection of the electrodes 1, 2, but on the top of the contact material 3. Such as this is shown in perspective in FIG. 3*a*, the first electrode 1 is provided on a not shown substrate and for instance made of aluminum. Above the aluminum electrode an electrical isolating layer 4 is provided and on the top of the electrical isolating layer a second electrode 2 of a second electrical conducting material, for instance gold. Everywhere where the isolating layer 4 is not covered by the gold electrode 2, it is etched away such that no direct contact is achieved in the intersection between the electrodes 1, 2 and neither any electrical contact. Over the intersection of the electrodes 1, 2 the contact layer 3 is provided and on the top thereof and at the intersection such that it substantially extends somewhat beyond thereof, the functional element 7 is provided, for instance in the form of a sensitive polymer.

If the functional element is to be used as a basic element in a matrix device, such as is further discussed in connection with FIG. 7, it must either be connected to a diode structure and have an inherent rectifying behaviour in order to avoid crosstalk problems in passive addressing of the matrix device.

Figure 3A:
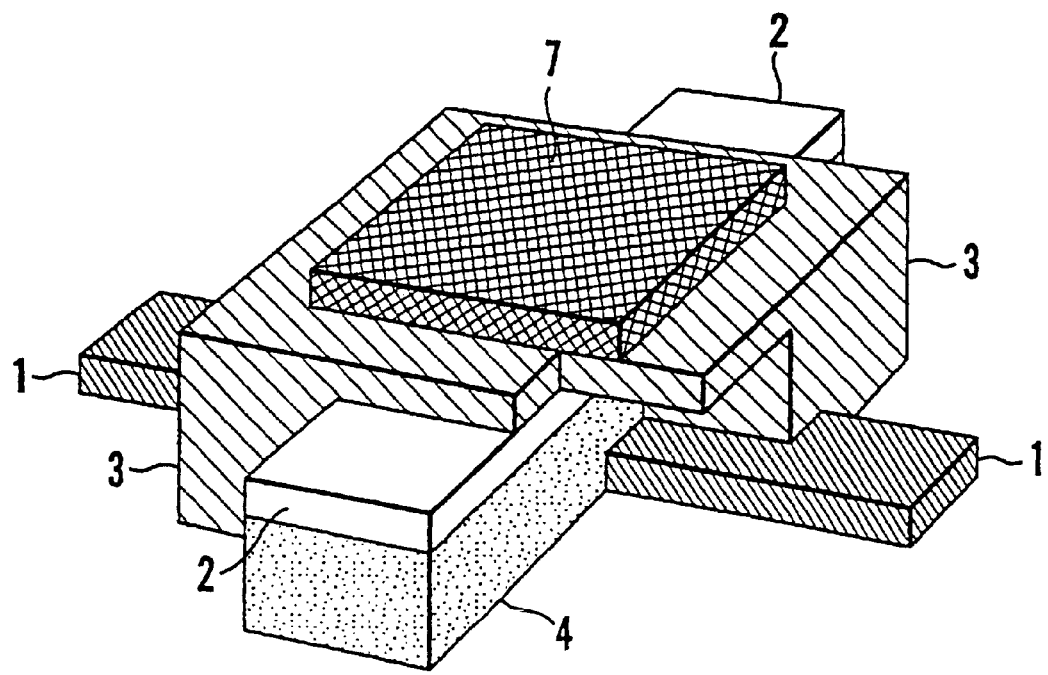
Figure 3B:
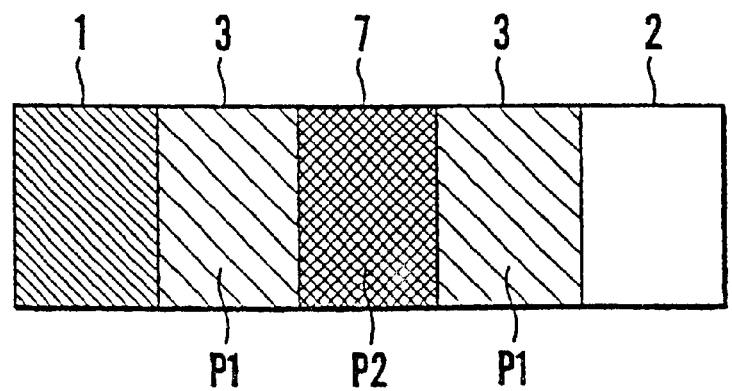
Figure 3C:
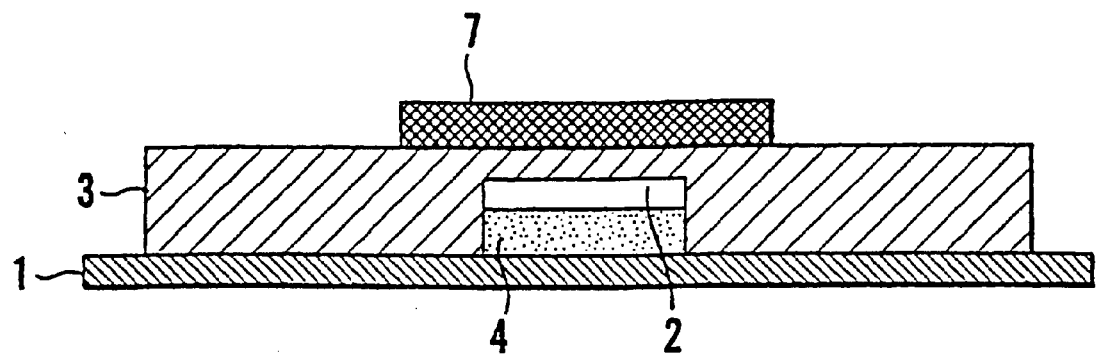

The principle structure of the functional element 7 realized with a detecting function is shown in FIG. 3*b*. The first electrode 1, here indicated as a metal electrode of aluminium, forms with a first polymer material P1 in the form of PTOPT a rectifying Schottky junction, wherein the metal forms the cathode. A second polymer material P2 forms the active or detecting element itself and may be designed such that it changes its conductivity by a physical or chemical stimulus. The second electrode which is designed as a metal electrode of gold, comprises the anode of the structure and forms a non-rectifying connection with polymer P1 (PTOPT). Aluminium was selected as the metal of the first electrode, as it has such a low work function as 4.3 eV. The gold anode has a higher work function, namely 5.2 eV.

With the use of a structure or geometry as shown in FIG. 3*b* it is possible to monitor the conductivity state of the sensitive polymer P2 which here is denoted as POWT, directly from the current-voltage characteristics of the means. Experiments show that the rectifying efficiency of a junction between Al and doped PTOPT was poorer than with a junction wherein undoped PTOPT was used, even if the current strength for a given voltage was substantially higher. However, it is regarded that the rectifying property of the junction is more important than the bulk conductivity and hence preferably undoped PTOPT was used in the sensor element.

As PTOPT is soluble in non-polar solvents, a polymer soluble in polar solvents must be used for sensitive polymer material, as the PTOPT layer otherwise would be destroyed during a spin coating of this polymer. A water soluble polythiophene was chosen, namely poly(3[(S)-5-amino-5-carboxyle-3-oxapentyl)-2,5-thiophenyl hydrochloride] (POWT). This molecule has an unprotected amino acid side chain which shows a remarkable solvent dependent specific rotation and circular dichroism spectrum, something which is interpreted as being caused by a partial interconversion between syn- and antiorientations of the adjacent side chains along the polymer chains. This polymer is also soluble in methanol and dimethyl sulfoxide. It can be doped with iodine ($I_2$) or with a acetonitrile solution of nitrocyltetrafluoroborate ($NOBF_4$). This polymer material (POWT) has the remarkable property that it is possible to link different protein species to the amino acid side chains of the molecule. Hence it may be possible to use a protein which has the effect of changing the conductivity of the polymer as a reaction to the biochemical stimulus, something which may be of great interest if the functional element shall be used as a detector for specific chemical reagents. The functional element 7 designed as a sensitive polymer may be spin coated or deposited such that it forms a pattern on the top of the contact layer 3, as this is shown in FIG. 3a. In this geometry the current will pass through the sensitive polymer material and follow the current path which is mentioned, viz. from the second electrode 2 of gold to a PTOPT layer and further through the sensitive polymer POWT to the junction between the PTOPT and the first electrode 1 of aluminium.

Figure 3D:
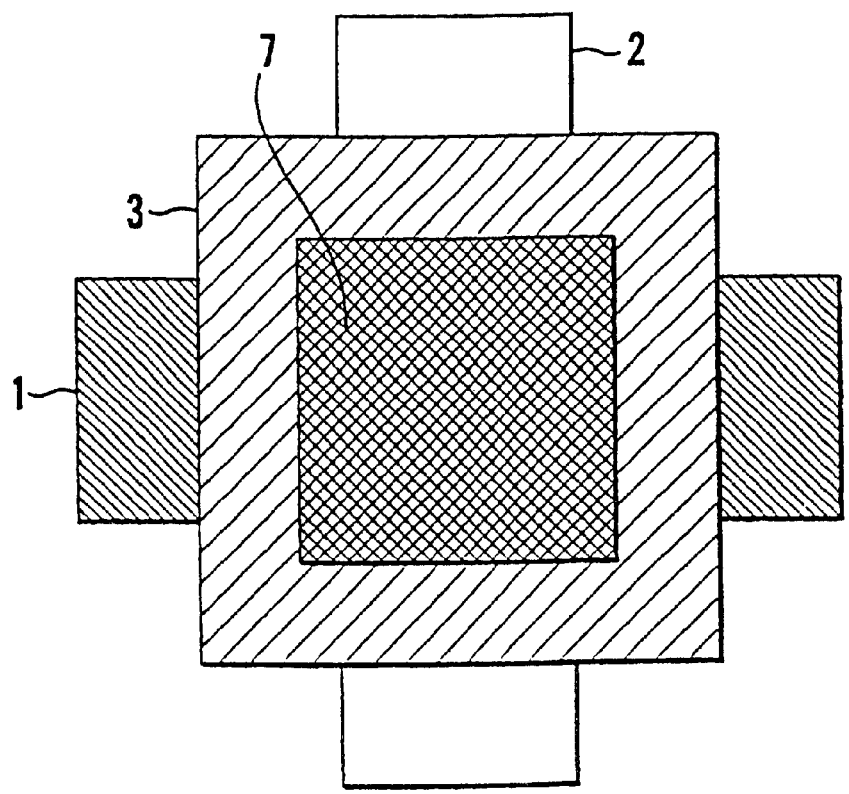

The functional element 7 may itself be a portion of the contact layer 3 which corresponds to the area which is covered by the functional element as shown in FIG. 3a and the active areas of the functional elements will then in reality correspond to the active area 3' as shown in FIG. 2b, viz. the portion of the contact layer 3 which is located on one side of the second electrode 2 and extends to the first electrode 1 where the side edge of the first electrode intersects the other electrode. FIG. 3d and FIG. 3e show respectively a section and a plan view of the electrode means wherein the functional element 7 is provided as a separate component on the top of the contact layer 3 and over the intersection of the electrodes 1,2. The functional element 7 may in any case be accessed both from the first and the second electrode. Depending on the material used in the functional element 7 it may have a detecting function, i.e. function as a sensor, have an information storing function, i.e. designed as an electrically addressable memory element or it may have an information indicating function, e.g. by being designed as a radiation emitting element.

If the functional element 7 is realized with a sensor function, it may be for instance be made such that it gives a variable resistance as a result of a stimulus, for instance as a response to a biological material, a chemical reagent, light radiation or pressure, and the output signal will be a current. The functional elements 7 may also be designed in a material whose electrical properties may be controlled or changed by applying a voltage or injection of current and charge.

If the functional element 7 particularly is realized with conjugated polymers as mentioned above, the electrical or photoelectrical properties of these materials make it possible to detect the presence of dopant species or incident light by the conductivity of the material being changed. In addition also conjugated polymers, as mentioned, may emit light by forming domains 5 which function as light-emitting domains. Further it is possible to modify properties of conjugated polymers in this respect by tuning their sensitivity and selectivity vis-a-vis a specific chemical reagent or to a specific wavelength. A number of conjugated polymers has these properties, but particularly it has been preferred using substituted polythiophenes (PTOPT).

Figure 4:
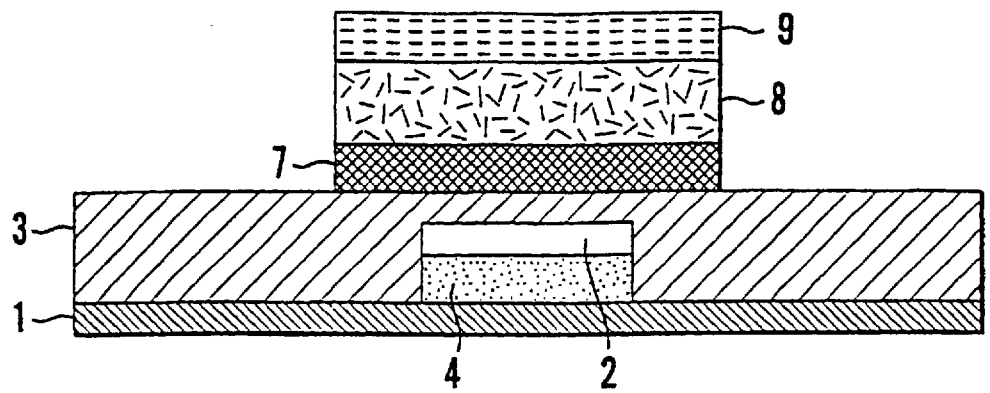
Figure 5:
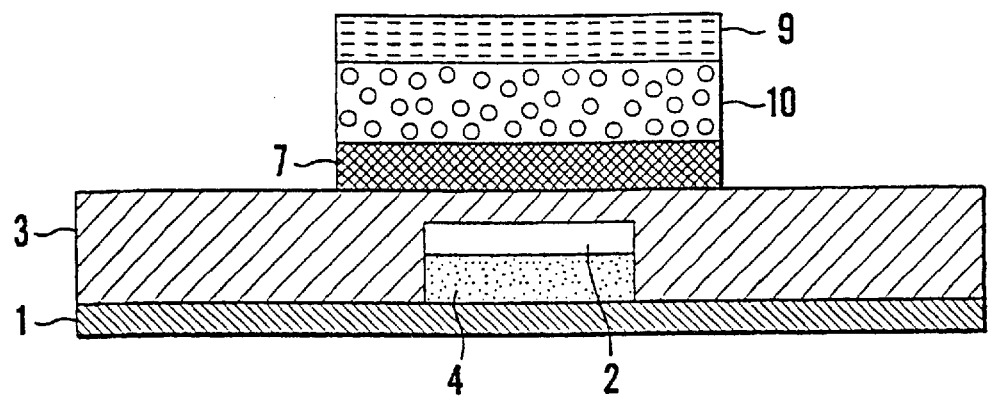
Figure 6:
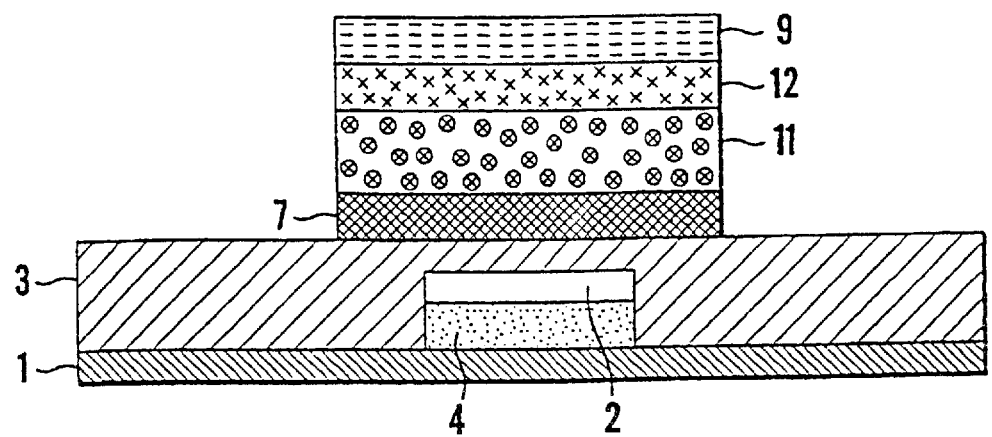

With reference to FIGS. 4, 5 and 6 it shall now be described how the functional element may be addressed and controlled.

FIG. 4 shows a section through an electrode means with a fictional element 7 in the form of a sensor element provided over the contact layer 3 at the intersection of the electrodes 1, 2. The material in the functional element 7 must in this case be a conductor, e.g. of organic or inorganic metal or semiconductor. Specifically the electrode means in FIG. 4 is shown adapted for voltage addressing with regard to for instance writing of a liquid crystal element provided over a functional element 7. The liquid crystal element may then be regarded as a pixel in a liquid crystal screen. The liquid crystal element 8 contacts an electronic conductor 9 which forms a third electrode of the electrode means. The intention is now that the voltage addressing takes place with a waveform such that some specific process which in this case will be the orientation state of the liquid crystal element 8, is controlled.

If the electrode means in FIG. 3a is used for driving a liquid crystal display, it is only necessary with voltage as the driving does not require particularly high currents. If the liquid crystal element in FIG. 4 are interchanged with an electroluminescent element 10, this will require substantially higher currents, but the principle for driving is once more very similar to that for driving of the liquid crystal display. In this case the electronic isolator 8, i.e. the liquid crystal element, is replaced by a homogenous layer 10 of an electroluminescent material, preferably conjugated polymer, as this is shown in FIG. 5. Over the electroluminescent layer 10 there is once again provided a third electrode 9 in form of an electronic conductor 9 which covers the whole layer and it is addressed simultaneously with the functional element 7 such that current passes through the electroluminescent layer 10. In this connection it is essential that a sufficiently high current can be injected in the functional element 7 such that the polymer material in the electroluminescent layer 10 becomes light-emitting. The fictional element 7 is here a current injectable inorganic or organic metal or a current injectable semiconductor.

If the functional element 7 is realized as a charge-storing inorganic or organic metal or a charge-storing semiconductor, it may further comprise electroactive or electrochromic materials. The electrochromic material may once again preferably be a conjugated polymer and the functional element may now be realized as a pixel in an electrochromic image screen as it is shown in FIG. 6. Above the functional element 7 there are in this case provided a solid electrolyte layer 11, preferably in the form of a thin film of polymer electrolyte, and thereabove a third electrode 12 of an electroactive material. By current and charge addressing of the functional element 7 the state of the electrochromic material with a functional element 7 will change when a current passes through the polymer electrolyte 11 and the overlying electroactive electrode 12. When this takes place, the colour of the electrochromic material in the functional element 7 changes and this change will continue until the injected charge once again disappears. This is the basis of electrical addressing of electrochromic thin-film screens which may be used for reversible registration of information. Addressing and writing to the electrochromic film screen must then be combined with a reading of the state of the functional element 7. As most electrochromic materials also change their resistivity when the doping state changes, it is possible first to control this by injecting current through the functional element 7 which is contacting the electroactive counterelectrode 12 over the interposed solid electrolyte 11 or polymer electrolyte. This changed doping state may thereafter be found by addressing the functional element 7 with a current and reading the resistance of the functional element. Preferably there may in this regard also be provided an electronic conductor 9 above the electroactive electrode 12. This may be used for realizing a memory element. Even if writing and reading in this case takes place with low speed, this embodiment makes it possible to integrate such memory elements in a two-dimensional matrix and stack such matrices above each other, such that a volumetric data storage device is obtained.

The electrode means as shown in FIG. 3a and in FIGS. 4, 5 and 6 may easily be integrated in a quasi two-dimensional matrix to an electrode device 13 wherein the electrodes 1, 2 in the separate electrode means now forms continuous striplike structures which respectively comprise rows and columns of electrodes 1, 2 in the matrix, the rows in the following being denoted as the x electrodes and the columns as the y electrodes of the electrode device.

Figure 7:
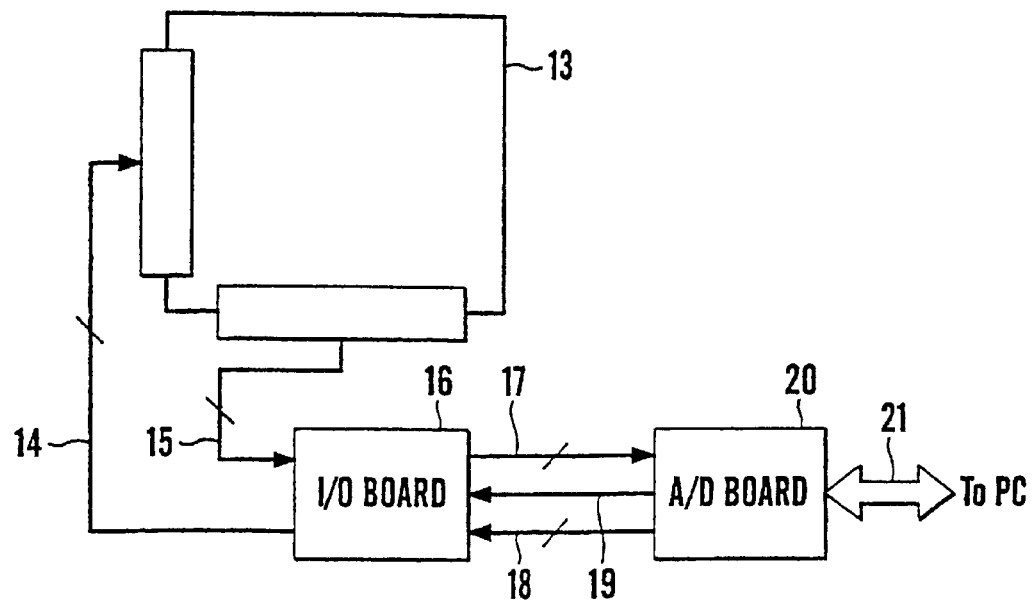

The electrode device 13 implemented as a two-dimensional matrix is shown in approximate block diagram form in FIG. 7. The matrix which more correctly may be denoted as a quasi two-dimensional matrix, as it necessarily must have a certain thickness, is over a line 14 for the drive voltage or the row electrodes of the x electrodes connected with an I/O converter board 16 while a line 15 for the output signals from the y electrodes similarly is conveyed to the I/O converter board 16. The output signals from the y electrodes are converted into a voltage and output on a line 17 to an A/D converter board 20 wherefrom the digitalized output signals or response signals may be conveyed further to a suitable data processing device on a data bus 21. The data processing device may be a common PC or a dedicated work station, and it is not shown in the figure. A line 19 for the drive voltage of the row electrode, i.e. their bias voltage, is similarly conveyed from the A/D converter board 20 and to the I/O converter board 16 together with the selector line 18 for selecting the electrode row to be driven. In the matrix of the electrode device 13 the contact layer 3 may now integrated form a global contact layer in the matrix such that the electrical conducting or semiconducting material of the contact layer are located over both electrode layers and contacts these electrically. The functional elements 7 for each electrode means may be provided in the contact layer and form a part thereof, the functional element then being formed at the intersection of an x electrode and a y electrode in each electrode means which are included in the matrix of the electrode device 13. The functional element 7 may also be provided as separate element and assigned to each of the electrode means, such this is shown in FIG. 2c. In principle that may take place by the functional element 7 being provided in a layer above the contact layer 10 and patterned such that separate functional elements are obtained for each electrode means 2. This is, however, no prerequisite as the functional elements 7 very well may be formed in an unpatterned layer of material which forms the functional elements and which is deposited over the contact layer 3. First by the addressing the functional element 7 is generated as an active structure assigned to the separate electrode means in the matrix.

The electrode device in FIG. 7 may also be provided with more than one layer of functional elements 7, as the separate layer of functional element then must be separated by an electronic or ionic conductor layer.

Figure 8:
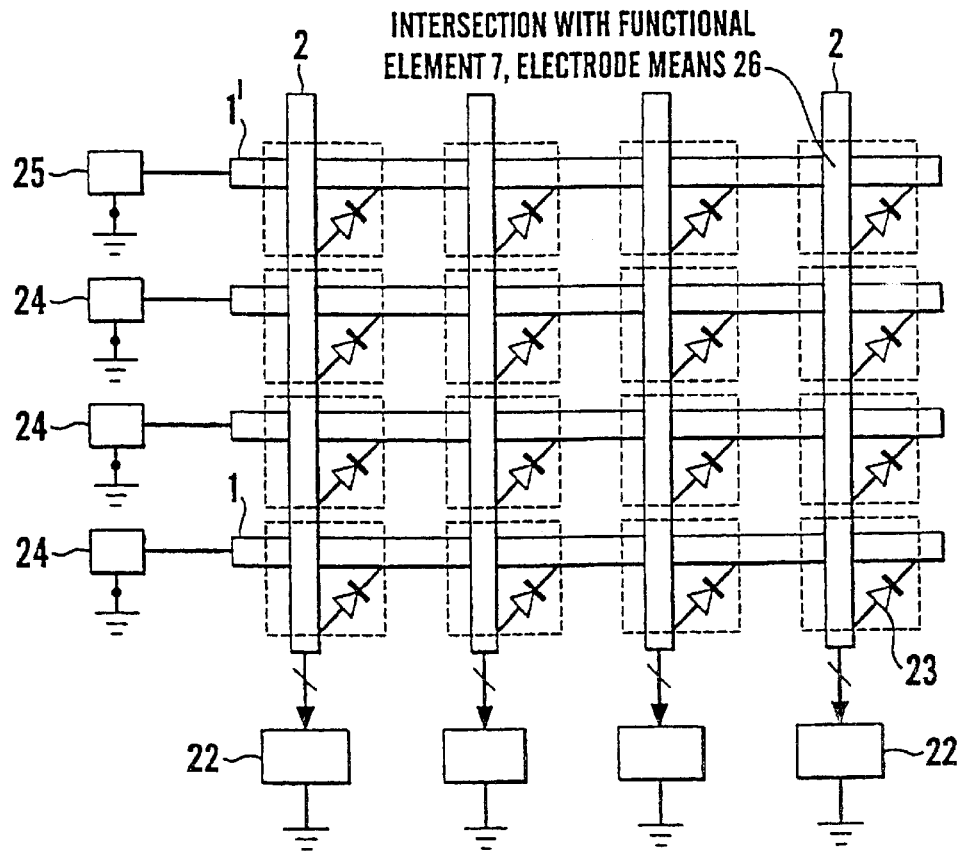

FIG. 8 shows a simplified electrical equivalent model of the network formed by the x electrodes and y electrodes 1, 2 in the matrix of the electrode device 13 in FIG. 7. At each intersection between the row electrodes and the column electrodes a diode 23 which in each case has the same conduction direction, is generated. Possibly the electrode device may also be realised with an inherent rectifying function in order to avoid crosstalk problems by addressing, cf. the description above of the functional element in connection with FIG. 3a and the immediate preceding section. The selective addressing of the separate electrode means 26 namely requires that a rectifying contact is present in each electrode means, for instance between the first electrode 1 and the contact layer 3. When the functional element 7 in an electrode means 26 in an x,y position in the matrix shall be read, a current transition between adjacent locations (x+1,y), (x−1,y),(x,y+1) or (x,y−1) must not take place. This is evident from FIG. 8 wherefrom it is seen that two opposite diodes block a current transition of this kind.

With the electrodes provided in matrix form in the electrode device, such as shown in FIG. 8, current only will pass through the contact layer 3 or between the electrodes 1, 2 in the active area 3' such as shown in FIG. 2a. If simultaneously for instance a physical or chemical stimulus changes the conductive properties of the polymer material in this area, for instance due to the incident light, the change will be detected by application of voltage and reading of the corresponding current of the output signal. If the electrodes 1, 2 in an electrode device are floating, i.e. the x electrode 1 is not biased, the current from the functional elements will also pass through adjacent functional elements in the electrode means with floating electrodes. This problem is solved by earthing the electrodes 2 as this is shown in FIG. 8 by using current/voltage converters 22 in all columns between their output and earth. As the input impedance of this current/voltage converts 22 is negligible, all column electrodes may be regarded as grounded. Preferably a buffer voltage was supplied to a selected row electrode 1;25 as all other electrodes 1;24 were floating. Then two advantages are obtained, namely that the current in each column of the other electrodes 2 only depends on the functional element identified by this column and the selected row and that all functional elements in the same row in principle may be monitored simultaneously. By monitoring of the electrode device there was in one embodiment used a specifically designed current/voltage converter board 16 which also applied the positive bias current to the chosen row 1', while a commercially available A/D converter board was used. The electrode device 13 may preferably be software-controlled over for instance a PC as this is indicated in FIG. 7, and it will over an interface of this kind be possible to select the voltage which can be applied to the rows and a possible waiting time before the first measurement is taken. The last feature is expedient with regard to avoiding transient phenomena such as capacity currents and it has in practice turned out advantageous to wait about 200 ms. The detected output currents may have a magnitude of a few pA such that noise generated from a network in the matrix thus may be a source of error. This disadvantage may be alleviated to some degree by including a very simple lowpass filter implementation by reading each functional element a number of times at a frequency selected by the user and average the measured values. As expected the best results were achieved by using monitoring periods which was a multiple of the voltage period of the network.

If the functional element in the layer is realized not as a global, but as a patterned layer, it will contact both the x and the y layers through the anisotropic conductor of the contact layer 3. By patterning the functional element 7 in the layer, neither separate functional element will shortcircuit to the adjacent functional element. It is, of course, thinkable with applications wherein the functional element layer is unpatterned and global. The functional element layer may then be a material which is in ohmic contact with the anisotropic conductor, but it may also be made such that it forms a rectifying contact with the anisotropic conductor in the contact layer 3. If the functional element 7 is formed with an ohmic contact, the resistance in the separate functional element may be measured by addressing the separate functional element, i.e. addressing the x,y position in the matrix. In this case the material of the functional element may for instance have a specific chemical response output and deliver an output signal in the form of a changed resistance when it is in contact with a chemical species. It may also be a biosensitive material which provides a resistance change by interaction with biomolecules and biosystems, a piezoresistive material wherein applied pressure changes the resistance of the functional element, a photoconductive material wherein light changes the resistance of the functional element, or a thermally sensitive material wherein heating changes the resistance of the functional element. The last cases cover a number of advantageous applications of the invention which each may be denoted as respectively a chemical camera, a biocamera, a photocamera and a thermocamera. Generally any interaction which changes the conductivity or resistance of the functional element may be read by using such an embodiment of the electrode device 13, irrespective whether the interaction has a physical, chemical or biological cause. Dependent on the function or the application the respective size of each separate functional element which in a camera application may be regarded as individual pixels in the camera, may be from 1 $\mu$m to 1 cm depending on the scale of object to be imaged. If the camera for instance shall image the local pH value at a biological cell, the functional element will be selected with dimensions with a magnitude of a few micrometers.

If the electrode device shall be manufactured as a number of identical and reproduceable devices, these may be made in a scale between 10 $\mu$m and 1 cm, such that the layers in the electrode device become homogenous over these dimensions. It is also thinkable that realization of the electrode device according to the invention in a camera application, particularly for detection of chemical reagents or biomolecules in a chemical camera respectively a biosensor with simultaneous detection of many substances and interactions, may be designed with functional elements to be used only once and possible combined with methods for positioning the functional elements at different locations on a surface. Another thinkable application is the use of chemically sensitive but non-specific polymers and combining a number of different materials in the functional element, for instance deposited by inkjet printing to different functional elements in the device such that it becomes possible to realize what may be described as an artificial chemical or biological sense organ for the detection of odour- or flavouremitting substances in a gas or liquid environment where it is desirable to detect the presence of chemical or biological interactions.

The electrode device 13 according to the invention may also comprise a contact layer 3 which has no anisotropic conductor, but wherein the contact layer which consists of a homogenous material which may react to biomolecules, chemical reagents, light or pressure, is deposited directly over the electrode structure. The functional element 7 will then be included in and form a part of this contact layer 3 and function as detectors where the active areas once again corresponds to edge areas 3' as shown in FIG. 2 and make possible detection of changes or specific characteristics in these active areas 3' when it is subjected to specific stimuli. The specific changes may for instance be a change of resistivity, capacitance or the current/voltage characteristics.

The electrode device 13 according to the invention may find application as a data processing device if the functional elements 7 are adapted such that they may be switched between different states and possibly be used for configuring logic gates or logic networks. Another and obvious application is using the electrode device 13 according to the invention as an electrically addressable data memory. Writing then takes place in each memory cell in the memory device, as the memory cell corresponds to the separate electrode means 26 and the memory device to the electrode device 13. The contact layer 13 itself may in this case advantageously function as a memory material and writing to a memory location, i.e. to the separate memory cell, may take place by changing the electrical properties of the contact layer in the active area in each electrode means 26 or memory cell. For instance may writing take place by destroying the conductivity such that there no longer is electric contact between the electrodes 1, 2 at the memory location in question. Possibly the memory device 13 may be realized such that the conductivity gradually is reduced. If this reduction takes place in predetermined steps, each memory location can store several bits and it will be possible storing bits according to a predetermined multilevel code. The storage density can thus be increased in a substantial degree. A closer description of the method for electrical addressing of a memory device and a discussion of complete embodiments of such memory devices are found in NO patent application No. 972803 filed on Jun. 17, 1997 and assigned to the present applicant. —Memory devices of this kind may also be designed volumetrically by stacking electrode devices above each other. Particularly with the use of coding in each memory location it will then be possible to obtain electrically addressable memory devices with an extremely high volumetric storage density.

The electrode device 13 according to the invention may also be used as an optical camera or electronic camera by realizing the contact layer or the functional layer as a photodiode matrix. This may for instance take place by using a well-known photodiode material, e.g. conjugated polythiophene mixed with buckministerfullerene $C_{60}$ in the contact layer. The function of a camera of this kind is indicated wholly schematically in FIG. 9.

The electrode device 13 can as mentioned above also be employed as a chemical camera, strictly spoken a chemical sensor for instance to detect a specific distribution of a chemical substance as indicated schematically in FIG. 10. It may then be used a functional element comprising a polymer layer of PTOPT.

It is the absence of barriers against mass transport to the polymer layer in the electrode device which makes it suitable for chemical detection, i.e. as a chemical camera. Since conjugated polythiophenes may interact with oxidating chemical species such that a highly conducting polymer material is formed, this may for instance be regarded as a model system for a chemical camera of this kind. It is for instance well-known that vapour of iodine will oxidize polythiophenes, including PTOPT which preferably is used in the present invention. This results in an increase in the conductivity of many magnitudes. Hence the functional element 7 may be addressed electronically such that the doping process which may be visualized in the form of an increased conductance, may be followed.

FIG. 10 shows schematically the result achieved by detection of iodine crystals on the detector of a chemical camera designed according to the invention and with the electrodes respectively of aluminium and gold with the use of an isolating layer of benzocyclobutene covered with PTOPT which forms both the contact layer and the functional element layer.

The electrode device 13 according to the invention may also be employed in a display device, indicated schematically in FIG. 11 by for instance being driven such that the functional element becomes electroluminescent. In the same structure as used for the application described in connection with FIG. 9 it may also be possible to generate light emission. In an embodiment conjugated polythiophene was used in the functional element layer and deposited over electrodes of indium tin oxide which was supplied with a voltage of +30 V with simultaneous grounding of the electrodes (row electrodes). The light source pixels are easily visible to the naked eye. In an embodiment the polymer pixels emit red light. By applying voltage to a specific electrode means in the electrode device light will be emitted from this electrode means only.

With the electrode means 26 and the electrode device 13 according to the present invention the great advantage is achieved that the functional element or the material in the functional element layer is exposed to and accessible from the environment simultaneously as it can be addressed electrically and hence make possible the detection of substances and stimuli to which the functional element material is sensitive.

The manufacture of the separate parts of the electrode means according to the invention is as per se known and for instance described in other connections, e.g. in the above-mentioned international patent application PCT/SE95/00549 and in a paper by M. Berggren, O. Inganäs & al. "Light emitting diodes with variable colours from polymer blends" Nature 1994, Vol. 372, p. 44. Yet as a guide for persons skilled in the art there is in a separate appendix furnished examples which are regarded as specific and informative in relation to the means according to the present invention. These examples are directed towards the manufacture of an anisotropic conducting material, the manufacture of the electrode means on a substrate and the application of the functional element layer to the electrode means according to the invention and both with and without the use of an anisotropic conductor.

APPENDIX

EXAMPLE 1
Forming of an Anisotropic Conducting Material 5 mg/ml poly[3-(4-octyl-phenyl)-2.2'-bithiophene] (PTOPT) is dissolved in chloroform and 5/mg/ml of polymethylmethacrylate (PMMA) likewise dissolved in chloroform. A mixture was formed from these solutions to prepare a solution of 6% PTOPT in PMMA. This solution is then spin coated onto a substrate at a rotation speed of 800 rpm to give a film with a thickness about 100 nm. The film thickness will then be comparable to the domains of the conjugated polymer, so that electrical conductivity normal to the film is high, and parallel to the film is negligible. If desired it is possible to convert the PTOPT to the doped form by exposing it to gaseous oxidants or to oxidants in solutions which will not dissolve the two polymers. If the polymer blend is deposited on a conducting substrate it is also possible to dope it to the conducting state by electrochemical doping.

EXAMPLE 2
Forming of an Anisotropic Conducting Material 5 mg/ml poly(3-octyl)-thiophene (POT) is dissolved in chloroform and 5 MG/ml of polymethylmetacrylate (PMMA) likewise dissolved in chloroform. A mixture was formed from these solutions to prepare a solution of 5% POT in PMMA. This solution is then spin-coated onto a substrate at a rotation speed of 800 rpm to give a film of about 100 nm thickness. The film thickness will then be comparable to the domains of the conjugated polymer, so that electrical conductivity normal to the film is high and parallel to the film is negligible. If desired it is possible to convert the POT to the doped form by exposing it to gaseous oxidants or to oxidants in solutions which will not dissolve the two polymers. If the polymer blend is deposited on a conducting substrate it is also possible to dope it to the conducting state by electrochemical doping.

EXAMPLE 3
Forming of an Electrode Device on a Silicon Substrate

A silicon chip is covered by aluminium strips (the x electrodes 250 nm thick) evaporated through a shadow mask. A layer of benzocyclobutene (BCB; (Cyclotene™, Dow Chemical) is spin coated at 1000 rpm for 30 seconds from a solution of BCB 1:10 in mesitylene, to make a film of 200–400 nm thickness. The film is cured at 250° C. for 60 minutes. A layer of gold (50 nm), undercoated with a 2 nm thick layer of Cr for adhesion, is evaporated through a shadow mask defining the y electrodes. The chip is etched in a plasma by reactive ion etching for 2 minutes. This leaves the gold electrodes inaffected, but removes the BCB from all other surfaces. The aluminium electrodes are exposed after this etching procedure. Anisotropic layers are deposited according to Example 1.

EXAMPLE 4
Forming of an Electrode Device on a Glass Substrate

A glass substrate is covered by benzocyclobutene (BCB) by spin coating and curing. This is used as the substrate for depositing further layers. The surface is covered by aluminium strips (the x electrodes, 50 nm thick) evaporated through a shadow mask. A layer of BCB (Cyclotene™, Dow Chemical) is spin-coated at 1000 rpm for 30 seconds from a solution of BCB 1:10 in mesitylene, to make a film of 200–400 nm thickness. The film is cured at 250° C. for 60 minutes. A layer of gold (50 nm), undercoated with a 2 nm thick layer of Cr for adhesion, is evaporated through a shadow mask defining the y electrodes. The chip is etched by reactive ion etching for 2 minutes. This leaves the gold electrodes unaffected, but removed the BCB from all other surfaces. The aluminium electrodes are exposed after this etching procedure. Anisotropic layers are deposited according to Example 1.

EXAMPLE 5
Deposition of a Functional Element Layer

A device according to Example 3 is covered with a homogenous thin film of poly(3 [(S)-5-amino-5-carboxyl-3-oxapentyl)-2,5-thiophenylene hydrochloride] (POWT) by solvent casting from a polymer solution. The resistance of each pixel of POWT is recorded. A small crystal of iodine is positioned at a pixel. The iodine is a dopant for POWT and the presence of iodine can be read as a decrease of resistance at the pixel.

EXAMPLE 6
Electrode Device without an Anisotropic Conductor

A device according to Example 3, but without the anisotropic conductors, is covered with a homogenous film of poly[3-(4-octyl-phenyl)-2.2'bithiophene (PTOPT) in a 5 mg/ml xylene solution and $C_{60}$ (buckministerfillerene) in a 5 mg/ml xylene solution. The film is formed by spin-coating at 400 rpm from a warm solution (50° C.). This film is photoresponsive, and local changes in the photocurrent or resistivity upon exposure to light can be detected.

What is claimed is:

1. An electrode means for addressing of a functional element comprising
    a first and a second electrode, the first electrode being provided in the form of a substantially strip structure of an electrical conducting material, the second electrode being provided over the first electrode in the form of a substantially strip structure of an electrical conducting material and in substantially orthogonal intersecting relationship to the first electrode,
    a layer of electrical isolating material being provided at an intersection between the first and the second electrode such that the electrodes overlap each other without direct physical and electrical contact and form a bridge structure, and
    a contact layer of an electrical conducting or semiconducting material being provided above the first electrode and the second electrode, electrically contacting both the first and the second electrode.

2. An electrode means according to claim 1, wherein the first electrode is provided on a substrate.

3. An electrode means according to claim 1, wherein the first and the second electrodes respectively consist of metal with different work functions such that the metal of the first electrode has a lower work function than that of the second electrode or vice versa.

4. An electrode means according to claim 3, wherein the first electrode consists of one of aluminium and an aluminium alloy.

5. An electrode means according to claim 3, wherein the second electrode consists of gold.

6. An electrode means according to claim 1, wherein the second electrode consists of indium-tin oxide.

7. An electrode means according to claim 1, wherein the contact layer forms a rectifying contact with the first electrode and an ohmic contact with the second electrode or vice versa.

8. An electrode means according to claim 1, wherein the electrically conducting or semiconducting material in the contact layer is an anisotropic organic conductor or semiconductor.

9. An electrode means according to claim 8, wherein the anisotropic organic conductor comprises an electrically isolating matrix in the form of a non-conducting polymer material and embedded therein at least an electrically conducting polymer material, said electrically conducting polymer material being separated in domains with an extension at least equal to the thickness of the contact layer.

10. An electrode means according to claim 9, wherein the non-conducting polymer material is selected from the class of homo- and copolymers of polyacrylates, polyesters, polycarbonates, polystyrenes, polyolefines or other polymers with a non-conjugated backbone.

11. An electrode means according to claim 10, wherein the non-conducting polymer material is polymethylmetacrylate (PMMA).

12. An electrode means according to claim 9, wherein the electrically conducting polymer material is selected from the class of polyheterocyclic polymers such as substituted polythiophenes, substituted polythiophenvinylenes, substituted polypyrrols, polyaniline and substituted polyanilines, substituted polyparaphenylvinylenes and their copolymers.

13. An electrode means according to claim 12, wherein the electrically conducting polymer material is poly(3-4-octyl-phenyl-2.2'-bithiophene) (PTOPT).

14. An electrode means according to claim 9, wherein the anisotropic electrical conductor is made from a solution mixture of polymer materials which is spin coated, solvent cast or melt cast.

15. An electrode means with detecting, information storing and/or information indicating functions, comprising
    a first and a second electrode and a functional element and with passive electrical addressing of the functional elements
    the first electrode being provided in the form of a substantially strip structure of an electrical conducting material, the second electrode being provided over the first electrode in the form of a substantially strip structure of an electrically conducting material and in substantially orthogonal intersecting relationship to the first electrode,
    a layer of electrical isolating material being provided at an intersection between the first and the second electrode such that the electrodes overlap each other without direct physical or an electrical contact and form a bridge structure,
    a contact layer of an electrical conducting or semiconducting material which contacts both the first electrode and the second electrode electrically being provided over the first electrode and the second electrode, and the functional element being provided integrated with said contact layer adjacent to or at the overlap of the electrodes, said functional element being configured as at least one of a sensor element, an information storing element and an information indicating element.

16. An electrode means according to claim 15, wherein the functional element is provided or formed as a part of the contact layer above the overlap of the electrodes, and substantially conformal therewith, or provided as a separate element above the contact layer and adjacent therewith such that the separate layer registers with the overlap of the electrodes.

17. An electrode means according to claim 16, wherein the electrical conducting or semiconducting organic material in the contact layer is an anisotropic conductor or semiconductor.

18. An electrode means according to claim 17, wherein the electrical conducting organic material is an anisotropic conductor and includes an electrical isolating matrix in the form of a non-conducting polymer material and embedded therein at least an electrical conducting polymer material, said electrical conducting polymer material being separated in domains with an extension at least equal to a thickness of the contact layer.

19. An electrode means according to claim 16, wherein the functional element is one of a potential-controlled inorganic, potential-controlled organic metal and a potential-controlled semiconductor.

20. An electrode means according to claim 19, wherein the functional element for voltage addressing contacts a thereabove provided liquid crystal layer which contacts a thereabove provided electronic conductor, said liquid crystal layer being controlled by applying a voltage between the functional element and the electronic conductor.

21. An electrode means according to claim 16, wherein the functional element is one of a current injectable inorganic, a current injectable organic metal and a current injectable semiconductor.

22. An electrode means according to claim 21, wherein the functional element for current addressing contacts a thereabove provided electroluminescent layer which contacts a thereabove provided electronic conductor, current being injected in the electroluminescent layer by applying a voltage between the functional element and the electronic conductor.

23. An electrode means according to claim 22, wherein the solid electrolyte is a polymer electrolyte.

24. AN electrode means according to claim 16, wherein the functional element is one of a charge-storing inorganic, a charge-storing organic metal and a charge-storing semiconductor, said materials including at least one of electroactive and electrochromic materials whose optical properties change with an amount of charge stored.

25. An electrode means according to claim 24, wherein functional element for current and charge addressing con tacts a thereabove provided solid electrolyte layer which contacts a thereabove provided electroactive material, a doping state in the functional element being changed by applying a voltage between the functional element and the electroactive material.

26. An electrode means according to claim 23, wherein the electroactive material contacts a thereabove provided electronic conductor.

27. An electrode device with detecting, information storing and/or information indicating function, wherein the device comprises two or more electrode means with passive electrical addressing of the functional elements in the electrode device, the electrode means being integrated in a quasi two-dimensional matrix, the first electrodes forming a patterned layer of row electrodes in the matrix, the second electrodes without being in direct physical or electrical contact with the row electrodes forming a patterned layer of column electrodes in the matrix, the contact layer either integrated forms a global contact layer in the matrix or patterned is assigned to each separate electrode means, the electrical conducting or semiconducting material in the contact layer being provided over both electrode layers and electrically contacting the electrode layers, and the functional elements provided in or over the contact layer forming one or more patterned or non-patterned layers of functional elements provided in respective two-dimensional matrices, the separate functional element registering with a respective intersection between a row electrode and a column electrode in the electrode layers.

28. An electrode device according to claim 27, wherein more than one layer of functional elements are provided, the separate layers of functional elements are separated by an electronic or ionic conducting layers.

29. An electrode device according to claim 27, wherein the separate functional element is an inorganic or organic metal or a semiconductor which generates a response signal in response to a specific physical stimulus.

30. An electrode device according to claim 27, wherein the separate functional element is an inorganic or organic metal or a semiconductor which outputs a response signal in response to a specific chemical reagent.

31. An electrode device according to claim 27, wherein the electrical conducting material in the contact layer is an anisotropic conductor, the anisotropic conductor contacts both the layer of row electrodes and column electrodes such that a self-adjusting electrical connection between the two electrode layers is obtained.

32. An electrode device according to claim 27, wherein the electrode device is realized in thin-film technology.

33. An electrode device according to claim 27, wherein the functional element layer is formed by a deposition of a polymer layer from a solution of a single conducting polymer or a polymer mixture comprising at least one conducting polymer, said conducting polymer being in a doped or an undoped state.

34. An electrode device according to claim 33, wherein the deposition of the functional element layer takes place by the polymer solution or the polymer solution mixture being spin coated, solvent cast or melt cast.

35. The use of electrode device according to claim 27 in an optical or electronic camera, wherein the functional element in the electrode device form pixels in a detector means in the camera.

36. The use of the electrode device according to claim 27 in a chemical camera wherein the functional elements in the electrode device form pixels in a detector means in the camera.

37. The use of the electrode device according to claim 27 is an electrically addressable memory device or an electrically addressable data processing device, wherein the functional elements in the electrode device respectively form memory elements or logic elements in the device.

38. The use of the electrode device according to claim 27 in an electrically addressable display device, wherein the functional elements in the electrode device form pixels in the display device.

39. An electrode means for addressing of a functional element comprising a first and a second electrode, the first electrode being provided in the form of a substantially strip structure of an electrical conducting material, the second electrode being provided over the first electrode in the form of a substantially strip structure of an electrical conducting material and in substantially orthogonal intersecting relationship to the first electrode, a layer of electrical isolating material being provided at the intersection between the first and the second electrode such that the electrodes intersect each other without direct physical and electrical contact and form a bridge structure, and a contact layer of an electrical conducting or semiconducting material being provided above the first electrode and the second electrode, electrically contacting both the first and the second electrode, the electrically conducting or semiconducting material in the contact layer being an anisotropic polymer conductor or semiconductor, the anisotropic polymer conductor comprises an electrically isolating matrix in the form of a non-conducting polymer material and embedded therein at least an electrically conducting polymer material, said electrically conducting polymer material being separated in domains with an extension at least equal to the thickness of the contact layer.

40. An electrode means according to claim 39, wherein the non-conducting polymer material is selected from the class of homo- and copolymers of polyacrylates, polyesters, polycarbonates, polystyrenes, polyolefines or other polymers with a non-conjugated backbone.

41. An electrode means according to claim 40, wherein the non-conducting polymer material is polymethylmetacrylate.

42. An electrode means according to claim 39, wherein the electrically conducting polymer material is selected from the class of polyheterocyclic polymers such as substituted polythiophenes, substitute polythiophenvinylens, substituted polypyrrols, polyaniline and substituted polyanilines, substituted polyparaphenylvinylenes and their copolymers.

43. An electrode means according to claim 42, wherein the electrically conducting polymer material is poly(3-4-octyl-phenyl-2.2'-bithiophene).

44. An electrode means according to claim 39, wherein the anisotropic conductor is made from a solution mixture of polymer materials which is spin coated, solvent cast or melt cast.

45. An electrode means with detecting, information storing and/or information indicating functions, comprising a first and a second electrode and a functional element and with passive electrical addressing of the functional element, the first electrode being provided in the form of a substantially strip structure of an electrical conducting material, the second electrode being provided over the first electrode in the form of a substantially strip structure of an electrically conducting material and in substantially orthogonal intersecting relationship to the first electrode, a layer of electrical isolating material being provided at the intersection between the first and the second electrode such that the electrodes intersect each other without direct physical or an electrical contact and form a bridge structure, a contact layer of an electrical conducting or semiconducting material which contacts both the first and the second electrically being provided over the first electrode and the second electrode, and a functional element being provided substantially adjacent to or at the intersection of the electrodes, said functional elements being configured as at least one of a sensor element, an information storing element and an information indicating element, the electrical conducting or semiconducitng material in the contact layer being an the anisotropic conductor or seminconductor, the anisotropic conductor comprises an electrical isolating matrix in the form of a non-conducting polymer material and embedded therein at least an electrical conducting material, said electrical conducting polymer material being separated in domains with an extension at least equal to a thickness of the contact layer.

\* \* \* \* \*